(12) United States Patent
Semmelrock et al.

(10) Patent No.: US 11,810,796 B2
(45) Date of Patent: Nov. 7, 2023

(54) WAFER CLEANING METHOD AND APPARATUS THEREFORE

(71) Applicant: LAM RESEARCH AG, Villach (AT)

(72) Inventors: Christoph Semmelrock, Villach (AT); Ulrich Tschinderle, Villach (AT); Reinhard Sellmer, Villach (AT); Walter Esterl, Villach (AT)

(73) Assignee: LAM RESEARCH AG, Villach (AT)

( * ) Notice: Subject to any disclaimer, the term of this patent is extended or adjusted under 35 U.S.C. 154(b) by 40 days.

(21) Appl. No.: 17/270,332

(22) PCT Filed: Sep. 16, 2019

(86) PCT No.: PCT/EP2019/074637
§ 371 (c)(1),
(2) Date: Feb. 22, 2021

(87) PCT Pub. No.: WO2020/058159
PCT Pub. Date: Mar. 26, 2020

(65) Prior Publication Data
US 2021/0320016 A1 Oct. 14, 2021

(30) Foreign Application Priority Data
Sep. 18, 2018 (GB) .................... 1815163.9

(51) Int. Cl.
*H01L 21/67* (2006.01)
(52) U.S. Cl.
CPC .... *H01L 21/6704* (2013.01); *H01L 21/67075* (2013.01)
(58) Field of Classification Search
CPC . B01F 23/45; B01F 25/23; B08B 3/02; H01L 21/02052; H01L 21/6704; H01L 21/67051; H01L 21/6708; H01L 21/67075
See application file for complete search history.

(56) References Cited

U.S. PATENT DOCUMENTS

| | | | |
|---|---|---|---|
| 3,149,783 A * | 9/1964 | Sosnick | B05B 1/3033 239/491 |
| 4,867,799 A | 9/1989 | Grebinski | |

(Continued)

FOREIGN PATENT DOCUMENTS

| | | |
|---|---|---|
| EP | 0390134 A2 | 10/1990 |
| EP | 0618611 A2 | 10/1994 |

(Continued)

OTHER PUBLICATIONS

Bey, EP-2857093-A1, Machine Translation. (Year: 2023).*

(Continued)

*Primary Examiner* — Duy Vu N Deo
*Assistant Examiner* — Christopher Remavege

(57) ABSTRACT

The present invention relates to a method for treating the surface of a wafer with multiple liquids, comprising rotating the surface of the wafer and discharging different liquid streams onto the rotating surface in a sequence from separate outlets, wherein the discharge of liquid streams which are contiguous in the sequence overlaps during a transition phase, and wherein during the transition phase the liquid streams merge after exiting said outlets to form a merged liquid stream before impacting the rotating surface. The invention also provides a liquid dispensing device incorporating a housing holding two or more liquid delivery tubes, wherein the tubes' outlets are inwardly angled towards one another, such that in use liquid streams delivered from the outlets of the two or more liquid delivery tubes merge to form a merged liquid stream.

13 Claims, 4 Drawing Sheets

(56) References Cited

U.S. PATENT DOCUMENTS

| | | | |
|---|---|---|---|
| 6,383,311 B1 | 5/2002 | Ochi et al. | |
| 7,004,181 B2* | 2/2006 | Isago | B01F 23/2132 |
| | | | 134/102.1 |
| 8,313,717 B2* | 11/2012 | Boe | B05B 1/26 |
| | | | 423/239.1 |
| 9,059,104 B2* | 6/2015 | Ratkovich | H01L 21/31111 |
| 10,388,537 B2* | 8/2019 | Kim | H01L 21/02074 |
| 11,322,346 B2* | 5/2022 | Park | B08B 3/022 |
| 2004/0000322 A1* | 1/2004 | Verhaverbeke | B08B 3/12 |
| | | | 257/E21.255 |
| 2006/0081269 A1* | 4/2006 | Kim | C23G 5/00 |
| | | | 134/2 |
| 2007/0223342 A1* | 9/2007 | Orii | H01L 21/67051 |
| | | | 369/69 |
| 2007/0261716 A1* | 11/2007 | Franklin | B08B 3/02 |
| | | | 134/198 |
| 2008/0283090 A1 | 11/2008 | DeKraker et al. | |
| 2009/0255558 A1* | 10/2009 | Inukai | H01L 21/67051 |
| | | | 134/30 |
| 2011/0259376 A1 | 10/2011 | Wagener et al. | |
| 2013/0078809 A1* | 3/2013 | Yu | H01L 21/6708 |
| | | | 438/689 |

FOREIGN PATENT DOCUMENTS

| | | | | |
|---|---|---|---|---|
| EP | 2857093 A1 * | 4/2015 | | B01F 5/0256 |
| JP | S61105847 A | 5/1986 | | |
| JP | 2004335671 A | 11/2004 | | |
| KR | 20150068761 A | 6/2015 | | |
| KR | 20180099037 A | 9/2018 | | |

OTHER PUBLICATIONS

International Search Report and Written Opinion of the ISA issued in PCT/EP2019/074637, dated Dec. 10, 2019; ISA/EP.

GB Search Report of the Intellectual Property Office issued in Application No. GB1815163.9, dated Mar. 15, 2019.

* cited by examiner

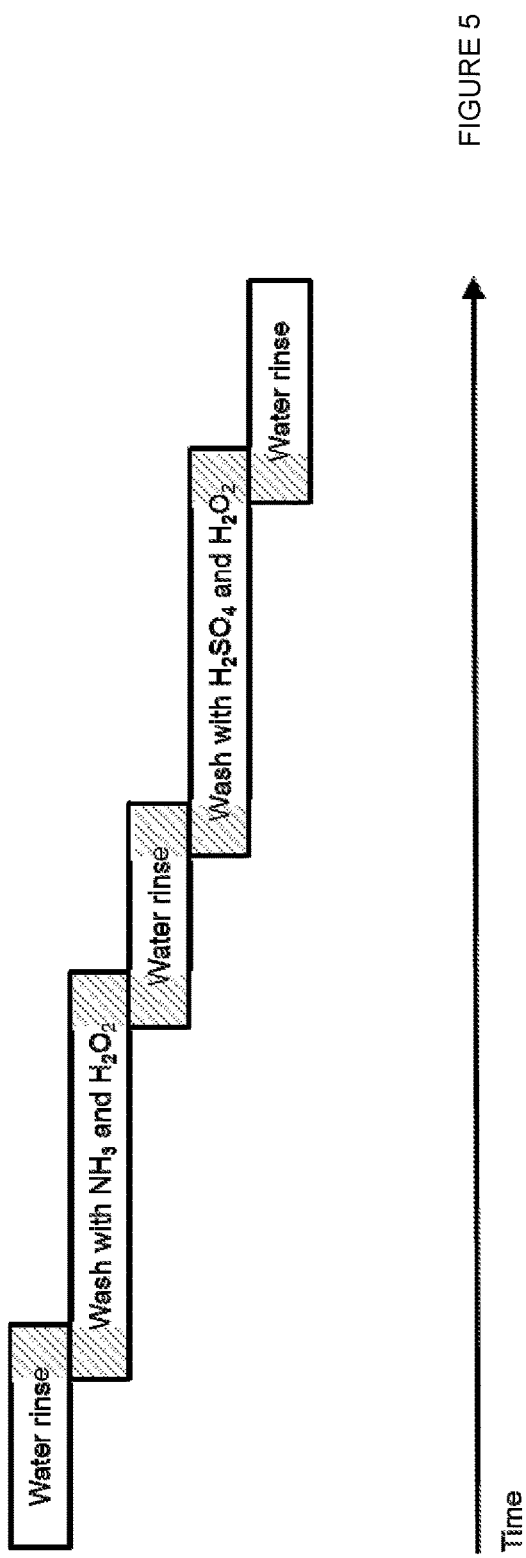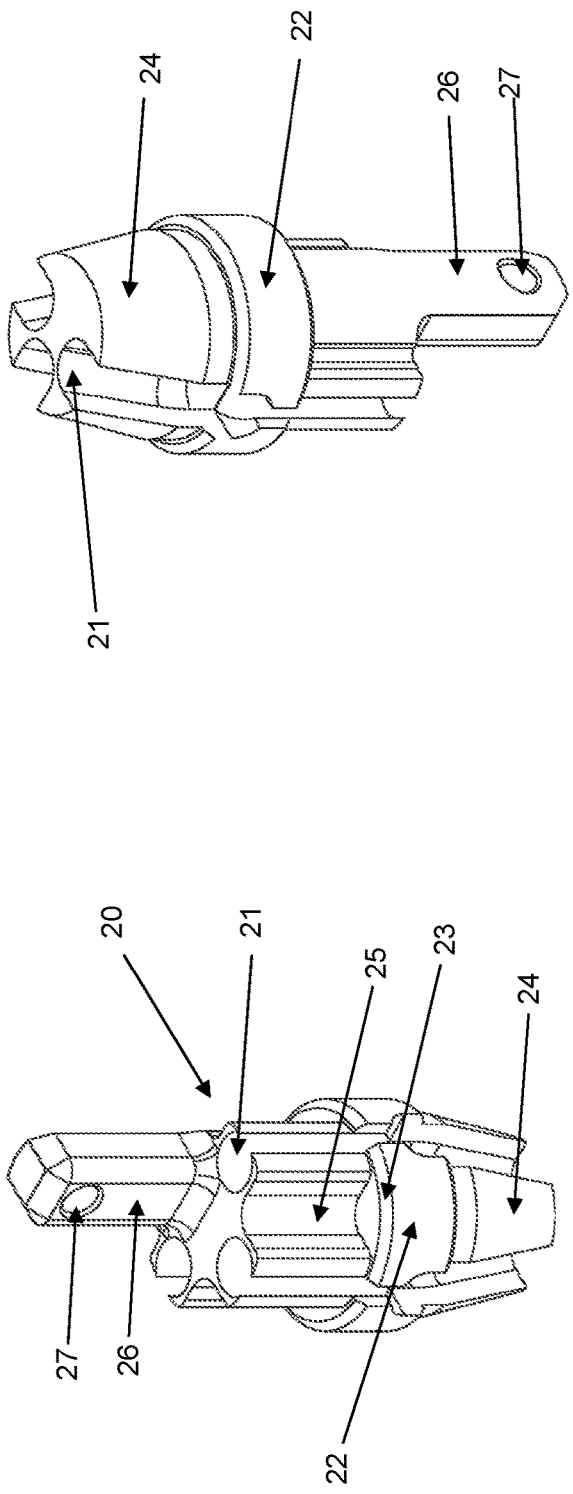

WAFER CLEANING METHOD AND APPARATUS THEREFORE

CROSS-REFERENCE TO RELATED APPLICATIONS

This application is a U.S. National Phase Application under 35 U.S.C. 371 of International Application No. PCT/EP2019/074637, filed on Sep. 16, 2019, which claims the benefit of Great Britain Patent Application No. GB 1815163.9, filed on Sep. 18, 2018. The entire disclosures of the applications referenced above are incorporated herein by reference.

FIELD OF THE INVENTION

The invention relates to methods and apparatus for washing wafers, in particular semiconductor wafers, for subsequent use in electronic devices.

BACKGROUND

The performance of semiconductor wafers is highly sensitive to contaminants present on the wafer's surface, and thus considerable efforts are made to limit potential sources of contamination and to remove contaminants whenever they occur. As part of this approach, wafers are subjected to washing steps during and after processing to remove residual contaminants.

One of the most commonly encountered washing procedures in wafer cleaning is the so-called "RCA clean", which is performed before high-temperature processing steps of silicon wafers. The cleaning involves the following multi-step sequence:

(1) removal of organic and particulate contaminants, typically using a mix of deionized water, ammonia and hydrogen peroxide;
(2) optionally, removal of a thin oxide layer which is created by step (1), typically using hydrofluoric acid;
(3) removal of ionic contaminants, typically using a mix of deionized water, hydrochloric acid and hydrogen peroxide; and
(4) rinsing and drying the wafer.

The simplest way to implement the RCA clean, and other wafer washing methods, is to immerse the wafer in a washing tank containing a washing liquid and optionally mechanically washing the substrate taken out from the tank with a brush. However, this method is not ideal, since contaminants mixed into the washing tank or affixed to the brush are able to re-deposit onto the wafer. In view of this, to make the washing method practically useful, it is necessary to ensure that the washing tank does not itself contribute significant levels of contaminations (for example, in the RCA cleaning method above it is not possible to use borosilicate glassware because impurities can leach out and cause contamination), and to use electronic grade (or "CMOS" grade) washing liquids.

To address the disadvantages associated with simple immersion of the substrate, it is known to subject wafers to spin washing. In this technique, washing liquid is sprayed onto a rotating wafer, held on a rotary block, so that the washing liquid flows over the edge of the wafer by centrifugal force before being scattered off the sides of the wafer. Advantageously, this flow of washing liquid helps to minimise re-deposition of contaminants lifted off the wafer surface and deposition of contaminants from the washing liquid itself, in a way not possible for tank washing.

An example of a spin washing apparatus suitable for delivery of a sequence of fluids is described in U.S. Pat. No. 6,383,331. In this system, the authors describe a system having multiple dispensing arms connected to a suspension device, which arms are all pivotable around the same axis, separately from one another. In this way, each arm is able to pivot into an "active" position above the wafer for dispensing a fluid, and then pivot away from the wafer into a "rest" position so as to avoid residual drips of fluid falling onto the wafer. To dispense multiple fluids, the device pivots a first dispensing arm above the wafer and delivers a fluid, pivots the first dispensing arm away from the wafer into a rest position, and pivots a second dispensing arm above the wafer to deliver a further fluid.

However, the present inventors have found that implementation of multi-step washing procedures, such as an RCA clean, using spin washing apparatus can be problematic. In particular, the centrifugal force can cause fast drying of the wafer between process steps, which can lead to deposition of contaminants from the various washing liquids. In addition, to implement the full RCA clean several different dangerous chemicals must be used, complicating the design of apparatus suitable for safely delivering all of the different components.

Accordingly, there remains a need to develop improved methods and apparatus for safely and efficiently washing wafers.

SUMMARY OF THE INVENTION

In view of the above deficiencies with the prior art, the present inventors have identified that contamination after multistep washing procedures can be minimised by implementing a spin washing procedure in which drying of the wafer between washing steps is limited or avoided. In view of this finding, the present inventors first sought to develop apparatus which allowed the delivery of a sequence of different washing liquids directly to a wafer's surface, where delivery of washing liquids contiguous in the sequence occurred simultaneously for a short "switchover" or "transition" period so as to keep the wafer continuously wet. However, it was found that when different liquid streams were delivered simultaneously to the rotating surface, a wave was generated between the different impact areas on the wafer, which led to significant splashing. Such splashing is highly undesirable for several reasons. Firstly, it leads to wasted washing liquid, because it disrupts the flow of liquid across the wafer's surface—a significant consideration when expensive, high purity ("CMOS" grade) liquids are being used. Secondly, the splashing can lead to inhomogeneous treatment levels across the surface of the wafer. Thirdly, the splashing can lead to safety issues due to the corrosive nature of many of the chemicals typically encountered in washing steps. Fourthly, the washing liquid can become deposited on the apparatus (for example the nozzle) leading to cross-contamination between steps, and potentially necessitating intermittent cleaning of the nozzle apparatus. In view of these problems, the inventors sought to develop a safer, more efficient continuous wet washing method, and thereby arrived at the present invention.

Specifically, in a first aspect, the present invention provides a method for treating the surface of a wafer with multiple liquids, comprising rotating the surface of the wafer and discharging different liquid streams onto the rotating surface in a sequence from separate outlets, wherein the discharge of liquid streams which are contiguous in the sequence overlaps during a transition phase, and wherein during the transition phase the liquid streams merge after exiting said outlets to form a merged liquid stream before impacting the rotating surface. Through this approach, the inventors have found that the wafer can be kept continuously wet during washing whilst minimising or eliminating undesirable splashing. In particular, allowing the liquid streams to merge into a single merged liquid stream before impacting the rotating surface means that the liquids are delivered to the same point on the wafer, thereby avoiding formation of the problematic wave which occurs when liquid streams are delivered to different parts of the surface during washing. In this connection, the skilled reader understands that the term "washing" used in this specification is intended to refer generally to a step in which liquid is discharged onto the wafer's surface, without limiting to specific purposes—for example, "washing" can be to clean the wafer so as to remove contaminants, or to carry out some chemical modification of the wafer itself.

In the method of the present invention, the multistep method can be separated into "treatment" phases and intervening "transition" phases, alternatively referred to as treatment periods and transition periods. The "treatment" phases correspond to time periods in which a particular treatment step is carried out. The "transition" phase(s) correspond to the switchover period between treatment steps adjacent in the treatment sequence (i.e. between treatment phases), during which time the two treatment steps are essentially carried out simultaneously. For example, for a multistep washing procedure involving step A and step B in which liquids X and Y are delivered respectively, the process has three phases (i) a treatment phase in which only X is delivered, (ii) a transition phase in which delivery of X and Y occurs simultaneously and (iii) a treatment phase in which only Y is delivered.

The duration of the transition phase(s) will depend on the particular protocol being implemented, but may be, for example, at least 0.1 seconds, at least 0.2 seconds, at least 0.3 seconds, at least 0.4 second, at least 0.5 second, at least 1 second, or at least 2 seconds. The upper limit for the duration of the transition phase(s) can be, for example, 0.5 seconds, 1 second, 1.5 seconds, 2 seconds, 3 seconds, 4 seconds, 5 seconds, 10 seconds, 20 seconds or 30 seconds. In methods involving more than one transition period, the transition periods may have the same duration, or may be different.

The duration of the transition phase as a percentage of the preceding treatment phase may be, for example, at least 0.01%, at least 0.1%, at least 0.5%, at least 1%, at least 2% or at least 5%. The upper limit for the duration of the transition phase as a percentage of the preceding treatment phase may be, for example, 40%, 30%, 20%, 10% or 5%; for example the percentage may be in the range of 0.01 to 40%, 0.1 to 30%, 0.5 to 20%, or 1 to 5%. In methods involving more than one transition period, the percentage duration of the transition phases (overall or individually) may be in accordance with the ranges above.

Suitably, the outlets are angled towards one another so as to form the merged liquid stream. The angle of the outlets is such that the flowpaths of the ejected streams intersect at a position "P" above the wafer's surface. Advantageously, arranging the outlets to combine liquid streams into a merged liquid stream above the wafer surface means that a single "column" of liquid impacts the wafer, thereby avoiding formation of the wave which results when simultaneously-delivered liquid streams are not combined, or only combine at the wafer's surface (i.e. where P≈0).

Suitable angles will depend on the flow rate of the liquid and the height of the outlets above the wafer surface. The angle can also depend on the type of chemicals being delivered—for example, in instances where the chemicals of the different contiguous steps undergo unwanted reaction with one another it might be advantageous for position P to be close to the wafer's surface to limit the time available for reactions to occur.

The angle can be defined in two different ways—either as a "straight flowpath intersection" angle, or a "true flowpath intersection" angle.

The "straight flowpath intersection" angle ($\theta_S$) of two outlets is the angle defined by two straight lines drawn from the two outlets assuming that no change in trajectory of the liquid flow occurs after ejection. The straight flow angle is therefore independent of the flow rate (it will be constant for a particular configuration) and ignores the effects of gravity. The flowpath is taken to be a line corresponding to the central point of the straight flow.

The "true flowpath intersection" angle ($\theta_T$) of two outlets is the angle at which flowpaths of liquid streams actually intersect in use. This flowpath therefore takes into account the true trajectory of the streams, taking into account the effects of flow rate and gravity. The flowpath angle between two liquid streams is determined by (i) measuring the trajectory of the first liquid stream in the absence of the second liquid stream (that is, with the second liquid stream stopped or diverted), (ii) measuring the trajectory of the second liquid stream in the absence of the first liquid stream; (iii) determining the point at which the trajectories intersect and measuring the maximum angle between the lines in the vicinity of that point. The flowpath is taken to be a line corresponding to the central point of the flow. If necessary, the trajectories can be modelled by quadratic equations to facilitate calculation of the point of intersection.

The straight flowpath intersection angle and true flowpath intersection angle can be the same, particularly at low angles and high flow rates. However, at higher angles and lower flow rates, differences in the two measures will occur.

Generally, the straight flowpath intersection angle is 40° or less, 35° or less, 30° or less, or 25° or less. The straight flowpath intersection angle may be at least 5°, at least 10°, at least 15°, or at least 20°. For example, the straight flowpath intersection angle may be 10° to 40°, 15° to 35°, or 15° to 30°.

Generally, the true flowpath intersection angle between merging liquid streams is 40° or less, 35° or less, 30° or less, or 25° or less. The true flowpath intersection angle may be at least 5°, at least 10°, at least 15°, or at least 20°. For example, the true flowpath intersection angle between said merging liquid streams may be 10° to 40°, 15° to 35°, or 15° to 30°.

Preferably, the liquid streams are discharged downwardly onto the rotating surface of the wafer (that is, in the general direction of gravity).

Generally the angle between the individual flowpaths and the axis of rotation of the wafer is 40° or less, 35° or less, 30° or less, or 25° or less, and generally at least 5°, at least 10°, at least 15°, or at least 20° (for example, 10° to 40°, 15° to 35°, or 15° to 30°) as determined according to either the "straight flowpath" or "true flowpath" method set out above.

The height at which the liquid streams merge during the method of the present invention is not particularly limited. The term "height" is used to denote in a general way the distance between the wafer and the point at which the liquid streams merge, without intending to limit to a specific orientation (vertical/horizontal). However, generally the liquid streams are discharged downwardly onto the rotating surface, in which case "height" has its standard meaning—that is the vertical distance between the point of intersection of the liquid streams and the wafer, with the point of intersection being above the wafer.

The height can be defined in two different ways—either as a "straight flowpath intersection height" ($H_S$) or a "true flowpath intersection height" ($H_T$). The calculation of these heights follows the same approach outlined above for the straight flowpath intersection angle and true flowpath intersection angle, except instead of measuring the angle at the point at which the trajectories intersect, one measures the distance to the surface of the wafer. As stated above, the height at which the liquid streams merge is not particularly limited. This is in contrast to EP 0 618 611, where the height is a key parameter since it determines the heat of the washing mixture at the point of impact. Nevertheless, it is generally preferred for the intersection height to be relatively small, so that the impact area does not shift significantly when switching from treatment phases to transition phases.

Generally, the straight flowpath intersection height is at least 2 mm, at least 5 mm, at least 10 mm, at least 15 mm, at least 20 mm, or at least 25 mm. The straight flowpath intersection height may be 100 mm or less, 90 mm or less, 80 mm or less, 70 mm or less, 60 mm or less, 50 mm or less, 40 mm or less, or 30 mm or less. For example, the straight flowpath intersection height may be 2 to 100 mm, 5 to 50 mm or 10 to 40 mm.

Generally, the true flowpath intersection height of the merging liquid streams is at least 2 mm, at least 5 mm, at least 10 mm, at least 15 mm, at least 20 mm, or at least 25 mm above the wafer's surface. The true flowpath intersection height may be 100 mm or less, 90 mm or less, 80 mm or less, 70 mm or less, 60 mm or less, 50 mm or less, 40 mm or less, or 30 mm or less. For example, the true flowpath intersection height of the merging liquid streams may be between 2-100 mm, 5 to 50 mm or 10 to 30 mm above the wafer's surface.

The merged liquid stream impacts the wafer, and subsequently flows over the wafer's surface due to the centrifugal force created by the wafer's rotation. The merged liquid stream can be made to impact any point of the wafer. However, usually, the merged liquid stream is discharged so as to impact the axis of rotation of the rotating wafer. Generally, this corresponds to the centre of the wafer about which the wafer rotates. In this way, the liquid can pass over the whole of the wafer, and will experience the maximum centrifugal force. As noted above, the method is generally implemented by discharging liquids downwardly onto a wafer rotating about an axis of rotation aligned with the direction of gravity. In such instances, to achieve delivery of the liquids so as to impact the axis of rotation of the rotating wafer, the point of intersection of the liquid streams is located on or proximate to the axis of rotation of the wafer (generally above the centre of the wafer).

The liquids in the method of the present invention are delivered to the wafer in the forms of streams/jets. In other words, the liquid flows as a "column" in a specific direction, instead of being delivered in the form of a disperse mist or spray which subsequently settles on the wafer.

The flow rate of liquid onto the wafer will be dependent on the particular application, but may be, for example, at least 0.5 L/min, at least 1 L/min, at least 1.5 L/min, or at least 2 L/min.

The rotational speed of the wafer may be, for example, at least 60 rpm, at least 100 rpm, at least 200 rpm, or at least 300 rpm.

The method of the present invention is used to treat the surface of a wafer (alternatively referred to as a "substrate"), and is particularly well suited to treatment of semiconductor wafers in which thorough and reliable cleaning protocols are of great importance. By "wafer" we mean a slice or sheet of (generally thin) material, suitable for rotating at the high speeds necessary to effectively implement spin washing. For example, the method may be applied to the treatment of silicon wafers.

Sequential Delivery Protocols

The method of the present invention can be used to carry out a large number of possible multistep surface treatments.

Generally, the multistep surface treatment will involve alternating active steps (in which one or more active chemicals are delivered to the wafer surface to react with the wafer and/or a component on the wafer's surface) and rinsing steps (in which one or more chemicals are delivered to rinse the wafer surface without reacting significantly or at all with the wafer and/or a component on the wafer's surface). Generally, the rinsing step uses water, most preferably purified water such as deionised water. In this way, the opportunity for chemicals associated with different active steps to interact is reduced or removed.

In some embodiments, the multistep surface treatment corresponds to an implementation of the RCA clean detailed in the background section above, with optional rinsing steps in between each of the active steps. For example, the method may involve treating the surface of a semiconductor wafer, in which the sequence of steps involves one or more cycles of the following:

(A) an optional rinsing step;
(B) a step to remove organic and/or particulate contaminants;
(C) an optional rinsing step;
(D) an optional step to remove a surface oxide layer;
(E) an optional rinsing step;
(F) a step to remove ionic contaminants; and
(G) an optional rinsing step;

or a variant of the above with the steps re-ordered, for example with the order of steps (A), (F), (G), (B), (C), (D), (E).

For example, the method may involve one or more cycles of the following steps:

(A) optionally, rinsing the surface with water;
(B) treating the surface with a mixture of ammonia and hydrogen peroxide;
(C) optionally, rinsing the surface with water;
(D) optionally, treating the surface with hydrofluoric acid;
(E) optionally, rinsing the surface with water;
(F) treating the surface with a mixture of acid (for example, sulphuric or hydrochloric acid) and hydrogen peroxide; and
(G) optionally, rinsing the surface with water;

or a variant of the above with the steps re-ordered, for example with the order of steps (A), (F), (G), (B), (C), (D), (E).

Preferably, the sequence includes at least one of rinsing steps (C), (E), and (G), most preferably all of rinsing steps (C), (E) and (G). Inclusion of the rinsing steps helps to avoid reaction between the different reagents used in steps (B), (D) and (F).

To implement the above procedure, the different liquid components are delivered from separate outlets in the manner set out according to the present invention. In steps involving use of a combination of different chemicals [that is, steps (B) and (F)] the chemicals may be pre-mixed and delivered from the same outlet.

In one embodiment, the method involves one or more cycles of the following steps:

(A) optionally, rinsing the surface with water discharged from a first outlet;
(B) treating the surface with a solution comprising a mixture of ammonia and hydrogen peroxide discharged from a second outlet;
(C) optionally, rinsing the surface with water, preferably discharged from the first outlet;
(D) optionally, treating the surface with hydrofluoric acid;
(E) optionally, rinsing the surface with water, preferably discharged from the first outlet;
(F) treating the surface with a solution comprising a mixture of acid (for example, sulphuric or hydrochloric acid) and hydrogen peroxide discharged from a third outlet; and
(G) optionally, rinsing the surface with water, preferably discharged from the first outlet;

or a variant of the above with the order of steps (A), (F), (G), (B), (C), (D), (E); wherein the sequence includes at least one of rinsing steps (A), (C), (E) and (G) per cycle.

Preferably, the sequence is selected from one of the following:
(B), (C), (F);
(B), (C), (F), (G);
(B), (C), (D), (E), (F);
(B), (C), (D), (E), (F), (G).

It is preferable that all rinsing steps are carried out using water discharged from the same outlet, since this limits the number of outlets required to implement the method of the present invention.

Cleaning Apparatus

The present invention also provides cleaning apparatus for carrying out the method of the present invention. More specifically, in a second aspect, the present invention provides cleaning apparatus for treating a substrate with multiple liquids, comprising:
a cleaning chamber;
a wafer holder in the cleaning chamber;
means for rotating the wafer holder; and
a liquid dispensing device, comprising a housing holding two or more liquid delivery tubes, wherein the tubes' outlets are inwardly angled towards one another, such that in use liquid streams delivered from the outlets of the two or more liquid delivery tubes merge to form a merged liquid stream.

In a third aspect, the present invention provides a liquid dispensing device, suitable for use in the cleaning apparatus of the second aspect. Specifically, such an aspect provides a housing holding two or more liquid delivery tubes, wherein the tubes' outlets are inwardly angled towards one another, such that in use liquid streams delivered from the outlets of the two or more liquid delivery tubes merge to form a merged liquid stream.

Optional and preferable features of the liquid dispensing device will now be described. It should be understood that the options and preferences set out below apply equally in respect of the first aspect of the present invention.

Suitably, the housing of the liquid dispensing device helps to hold and direct the liquid delivery tubes into their inwardly angled configuration. To this end, the housing may incorporate a passage for receiving the liquid delivery tubes, which passage bends the tubes into their inwardly angled configuration. For example, in a particularly advantageous configuration, the liquid dispensing device comprises:
a housing, defining an internal chamber opening at an exit port;
a spacer, located within the internal chamber of the housing; and
two or more liquid delivery tubes, passing along the spacer within the internal chamber of the housing, and extending to the exit port;
wherein the two or more liquid delivery tubes are bent around the spacer so that the tubes' outlets are inwardly angled towards one another, such that in use liquid streams delivered from the outlets of the two or more liquid delivery tubes merge to form a merged liquid stream. In this configuration, the two or more liquid delivery tubes may pass along/around the spacer between the spacer and wall of the internal chamber of the housing. In this way, for a given housing, the width of the spacer and its position relative to the exit port of the housing can be used to determine the angle of the tubes' outlets.

From the above, it is clear that the "spacer" is a component which guides the tubes into the desired angled configuration. Preferably, the spacer is a separate component. Although not essential in all embodiments, the spacer may be a separate component secured to the housing by a suitable fixing to limit or prevent relative movement of the housing and spacer. For example, the spacer may be secured to the housing by a screw, pin or plug. In such embodiments, the housing may have a through-hole which aligns with a corresponding hole in the spacer, for receiving said screw, pin or plug. It is preferable for the spacer to be a replaceable/removable spacer, which can be replaced with a further (optionally different) spacer. This is particularly advantageous in embodiments in which the liquid dispensing device is able to incorporate different spacers, since different spacers can be used to achieve different configurations using the same housing.

Generally, the housing encases the liquid delivery tubes, and helps to support the tubes. The housing may be a tubular housing, for example a cylindrical tubular housing (although other cross-sections are possible). In this way, the liquid delivery tubes may be inserted into/through the tubular housing.

In one embodiment, the housing and spacer clamp the two or more liquid delivery tubes in position, and the internal chamber of the housing narrows at or towards the exit port so as to bend the liquid delivery tubes around the spacer and thereby orient the tubes' outlets into said inwardly angled configuration. In this embodiment, the internal chamber of the housing may taper inwardly to produce said narrowing at or towards the exit port. In such cases, the spacer may be provided with a taper complementary to that of the housing, which extends within the tapered section of the housing. Such an arrangement provides a simple and effective way of providing a device with tubing in a desired configuration.

To help position the liquid delivery tubes, the spacer preferably has one or more channels/grooves suitable for accommodating the liquid delivery tubes. Optionally, the housing has one or more channels for accommodating the liquid delivery tubes. In instances where both the spacer and housing incorporate said channels, the channels may be complementary so as to form a closed conduit when the housing and spacer are assembled in the liquid dispensing device, so as to completely surround the tubes (e.g. by providing a half-pipe groove in the housing and a complementary half-pipe groove in the spacer for each liquid delivery tube). Optionally, channels are provided in the spacer without corresponding channels in the housing. This latter embodiment is particularly advantageous in instances where the spacer is replaceable within the housing, since it is possible to switch between different spacers having different numbers and/or arrangements of channels so as to implement different protocols, without interference from channels in the housing (which might otherwise interfere with correct placement when switching between different spacers). Preferably, the channels in the spacer are open channels (that is, they do not completely enclose the liquid delivery tubes), so as to facilitate insertion and removal of the liquid delivery tubes.

In one embodiment, the liquid dispensing device has two liquid delivery tubes which sit within two (preferably open) channels provided in/on the spacer. The channels may run along opposing sides of the spacer, to suitably space/distance the tubes.

In another embodiment, the liquid dispensing device has three liquid delivery tubes which sit within three (preferably open) channels provided in/on the spacer.

In particularly advantageous embodiments, the housing comprises a main body and a detachable cap, wherein the detachable cap includes said exit port. In this way, the detachable cap can be removed to allow adjustment of the spacer and liquid delivery tubes. In such embodiments, it is preferred for the spacer to be removable when the detachable cap is removed. In this way, it is straightforward to replace the spacer, either for maintenance reasons or to switch to a different spacer adapted to a different protocol. The detachable cap may be connected via any suitable engagement, such as a screw fit (threaded engagement), friction fit (push-fit) or snap fit. The detachable cap may be attached through engagement with the main body of the housing and/or the spacer. Suitably, the spacer is a separate component, which is held/clamped in place as the detachable cap is attached to the liquid dispensing device, but is free to be removed when the detachable cap is removed.

In one preferred arrangement, the liquid dispensing device comprises:
a housing, defining an internal chamber opening at an exit port, the housing having a main body and a detachable cap connected by a friction fit or screw fit engagement, wherein the detachable cap includes said exit port;
a spacer, located within the internal chamber of the housing; and
two or more liquid delivery tubes, passing around the spacer between the spacer and wall of the internal chamber of the housing, and extending to the exit port;
wherein the spacer has channels in its outer surface which accommodate the two or more liquid delivery tubes, and the inner surface of the detachable cap does not incorporate channels for accommodating the liquid delivery tubes. Advantageously, in this embodiment, the detachable cap is held in place by a robust screw fit or friction connection, but the lack of tube-supporting channels in the cap means that the cap can be rotated to allow its removal without applying significant rotation to the spacer and liquid delivery tubes. This means that twisting of the tubes can be minimised or eliminated during removal of the cap even in the absence of a fixing to secure the spacer/tubes relative to the main body of the housing. This means it is straightforward to avoid the tubes deforming or tangling, which could otherwise damage the liquid delivery tubes and also force the spacer upwards into the housing making its removal more difficult. Such an embodiment can also permit easy replacement of the liquid delivery tubes. In particular, removal of the detachable cap undoes the clamping force on the liquid delivery tubes, allowing the liquid delivery tubing to be pulled out of the housing (either upwardly or downwardly).

In the above particularly preferred arrangement, the main body may be a tubular housing (that is, a hollow tube). In this way, the liquid delivery tubes can be easily pushed/slotted into the hollow tube and secured in place by the detachable cap.

In a particular preferred arrangement, the spacer includes a stop surface, which abuts against a corresponding stop surface of the housing (for example, within the housing). The complementary stop surfaces can be used to help position the spacer within the housing and prevent the spacer being pushed too far into the housing. In one embodiment, the stop surface of the spacer is provided by a collar section.

In a particular preferred embodiment, the liquid dispensing device comprises:
a housing, defining an internal chamber opening at an exit port, the housing having a main body and a detachable cap, wherein the detachable cap includes said exit port;
a spacer, located within the internal chamber of the housing, having a collar section and an inwardly tapered section; and
two or more liquid delivery tubes, passing around the spacer between the spacer and wall of the internal chamber of the housing, and extending to the exit port;
wherein the spacer has channels in its outer surface which accommodate the two or more liquid delivery tubes and bend the liquid delivery tubes into their bent configuration over the lower inwardly tapered section, and wherein the collar section of the spacer abuts the lower part of the main body (the "mouth" portion of the main body) and the detachable cap is held in place on the collar of the spacer (for example, through a friction fit with the collar). The spacer is optionally secured to the housing through suitable securing means. Advantageously, this arrangement provides a device which is particularly simple and reliable to assemble. In particular, the device may be assembled by inserting the liquid delivery tubes through the main body of the housing, placing the tubes into the channels provided in the spacer, pushing the spacer into position in the main body of the housing until the collared section of the spacer contacts the mouth of the main body of the housing, and finally pushing/screwing the detachable cap into position onto the collar of the spacer so that the tubes adopt the required inwardly angled configuration.

Preferably, the liquid delivery tubes are a separate part held within the housing (as opposed to an integral part of the housing). The tubes may be plastic tubing, for example a fluorine based tubing such as perfluoroalkoxy tubing.

The outlets through which the liquids are delivered may be any suitable form for delivery streams/jets of a liquid at a suitable flow rate. The outlets may alternatively referred to as "nozzles". The outlet may simply be an open end of the liquid delivery tubing. Alternatively, the outlet may be a separate nozzle to guide the flow of the liquid. The outlet may have the same internal diameter as the conduit through which liquid is delivered, or may have some different shape—e.g. a smaller cross-section to increase flow rate. The internal diameter of the outlets will depend on the particular flow characteristics desired for a specific application, but may be, for example, at least 2 mm, at least 3 mm, at least 4 mm, at least 5 mm, or at least 10 mm.

Preferably, the outlets of the two or more liquid delivery tubes fall within the ranges given above for the "straight flowpath intersection angle", for example, between 10° to 40°, 15° to 35°, or 20° to 30°.

In the cleaning apparatus of the invention, the outlets are preferably positioned at a height above the wafer according to the ranges given above for the "straight flowpath intersection height". For example, the straight flowpath intersection height may be 2 to 100 mm, 5 to 50 mm or 10 to 40 mm.

The wafer holder may be a rotatable platform with suitable wafer gripping means. The wafer may be held by the rotatable platform by, for example, a vacuum chuck (or grip), edge gripping chuck or Bernoulli chuck (or grip). The cleaning chamber of the cleaning apparatus of the inventor may comprise an annular liquid collector surrounding the rotating platform and wafer, to collect liquid flowing from the surface of the wafer.

Spacer

In a further aspect, the present invention provides a spacer for use in the apparatus and the liquid dispensing device described above. In a particularly preferred embodiment, the spacer comprises:
- an upper section, having securing means for securing the spacer to a housing;
- a lower section, having an inward taper (for example, a frusto-conical section);
- a collar section, between the upper and lower sections, having a width greater than the upper and lower sections, to help position the spacer within a housing;
- wherein the outer surface of the spacer includes two or more channels for receiving liquid delivery tubes, and wherein the lower section helps to bend the liquid delivery tubes into a desired configuration.

Kit of Parts

In a further aspect, the present invention provides a kit of parts for assembling a liquid dispensing device according to the present invention. The kit comprises said housing, one or more spacers for positioning within said housing body, and optionally two or more liquid delivery tubes (although the latter can be supplied separately). Preferably, the kit includes at least two spacers having a different number of channels for accommodating liquid delivery tubes. For example, the kit may include a first spacer having two channels, and a second spacer having three channels. The components of the kit may have any of the preferred and optional features outlined above. In particular, the housing may be a multi-part construction, comprising a main body and a detachable cap.

BRIEF DESCRIPTION OF THE FIGURES

Embodiments of the invention will now be described, by way of example only, with reference to the accompanying drawings in which:

FIG. 5 is a flow chart showing the implementation of an RCA clean in accordance with the method of the present invention;

FIGS. 6A and 6B are perspective views of the top and bottom of a three-tube spacer;

DETAILED DESCRIPTION OF THE INVENTION

Figure 1:
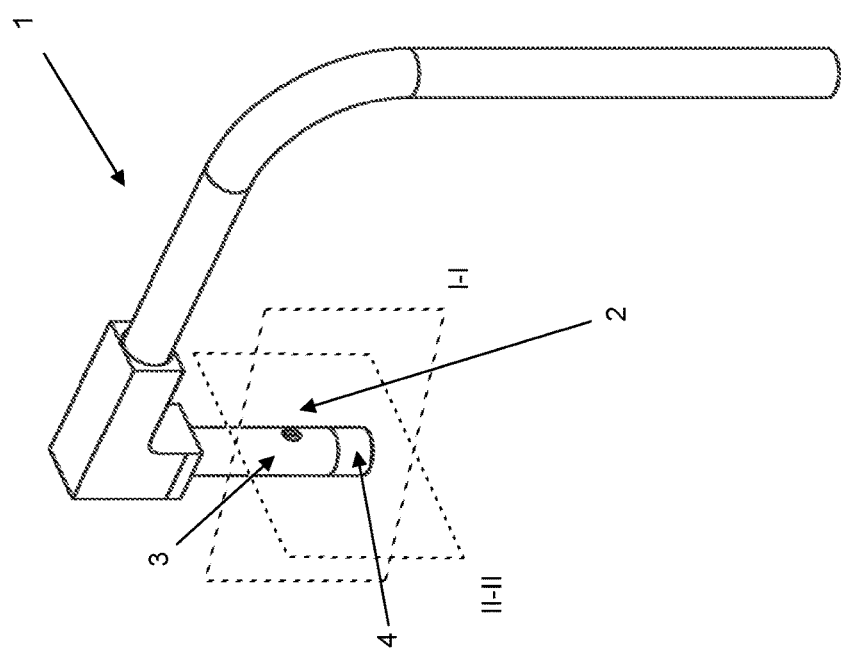
FIG. 1 shows a perspective view of a liquid dispensing device according to the present invention.

FIG. 1 shows a liquid dispensing device 1 according to the present invention. The device incorporates a tubular housing 2 having a main section 3 and a detachable cap 4. The housing contains a spacer 5 (shown in subsequent figures), secured in place by screw 6, as well as three PFA tubes 7 (shown in subsequent figures) connected to liquid reservoirs (not shown).

Figures 2A, 2B:
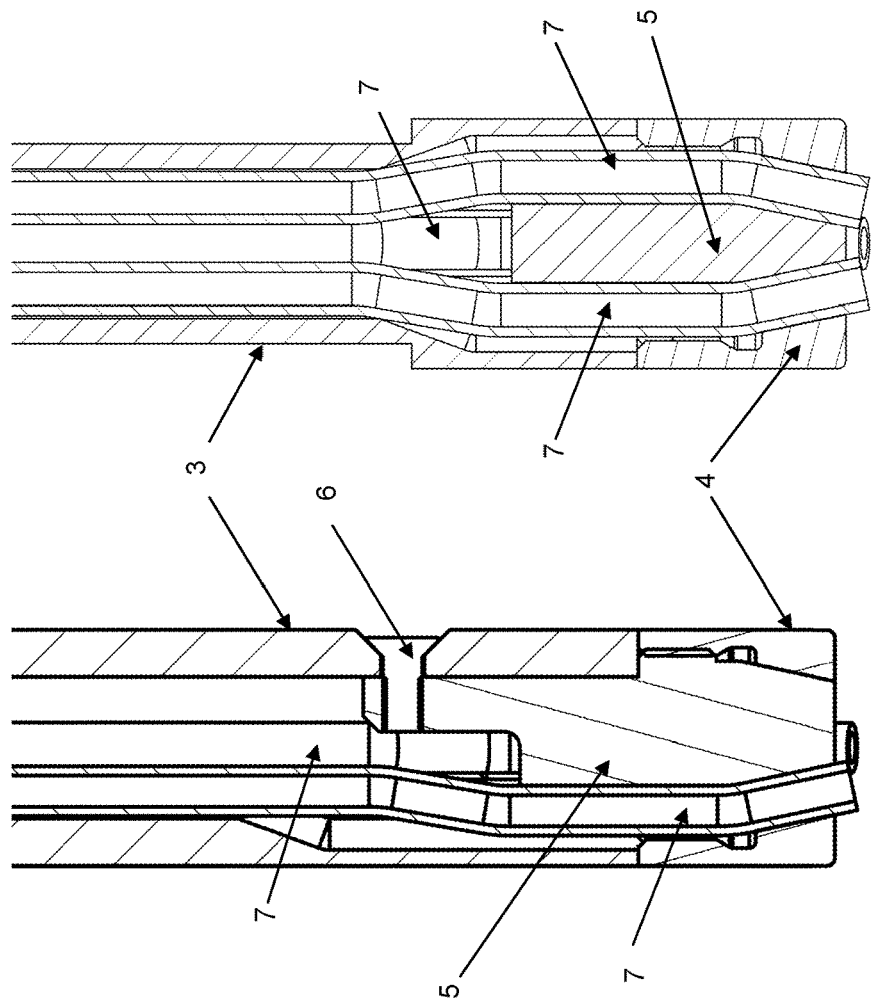
FIGS. 2A and 2B are cross-sections of the liquid dispensing device of FIG. 1, the two figures showing views orthogonal to one another.

FIGS. 2A and 2B are cross-sectional views of the interior of the housing 2 along the planes indicated by I-I and II-II in FIG. 1 respectively. The housing encases a spacer 5 and tubes 7, the latter of which protrude through the open end of the detachable cap 4 at an angle, due to an inward taper provided on the interior surface of the detachable cap 4 and corresponding tapered outer surface of the spacer 5.

Figure 3C:
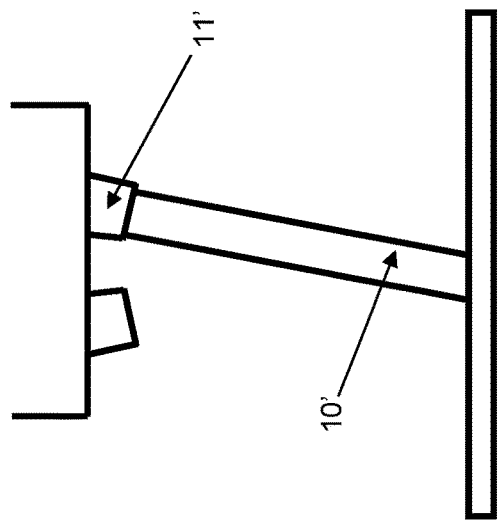
FIGS. 3A, 3B and 3C are schematic views showing a liquid delivery sequence in accordance with the method of the present invention.
Figure 3B:
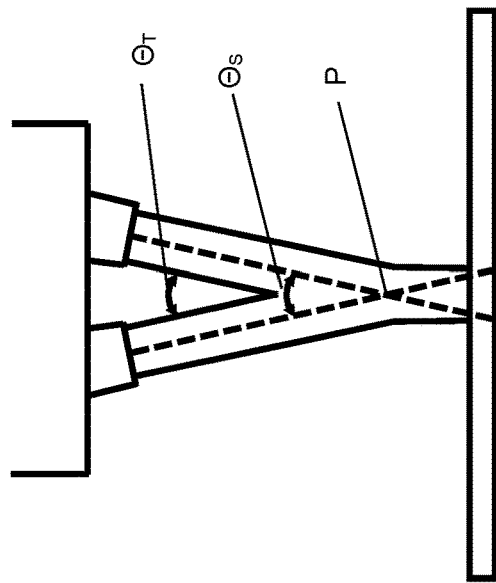
Figure 3A:
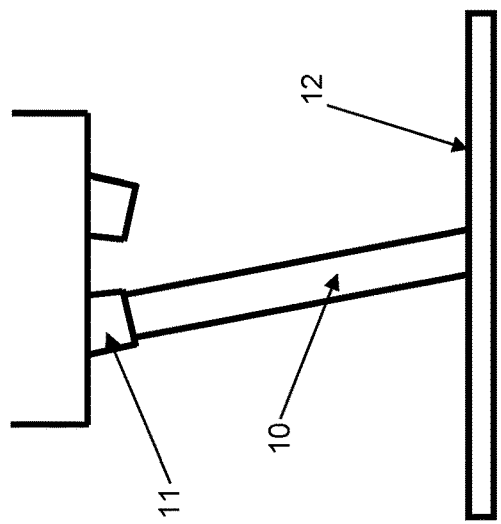

FIGS. 3A-C show operation of the device shown in FIGS. 1-2. In FIG. 3A a first washing step is carried out by delivering a flow of liquid 10 from first tube 11 onto rotating wafer 12. Next, in FIG. 3B the device enters a transition period in which flow of liquid 10' is delivered from second tube 11' whilst maintaining delivery of the first liquid 10 from the first tube 11. The liquids 10 and 10' form a single flow which impacts the rotating wafer at its centre point. Finally, in FIG. 3C the flow of liquid 10' continues with the flow of liquid 10 stopped, to effect a second washing step.

Figure 4:
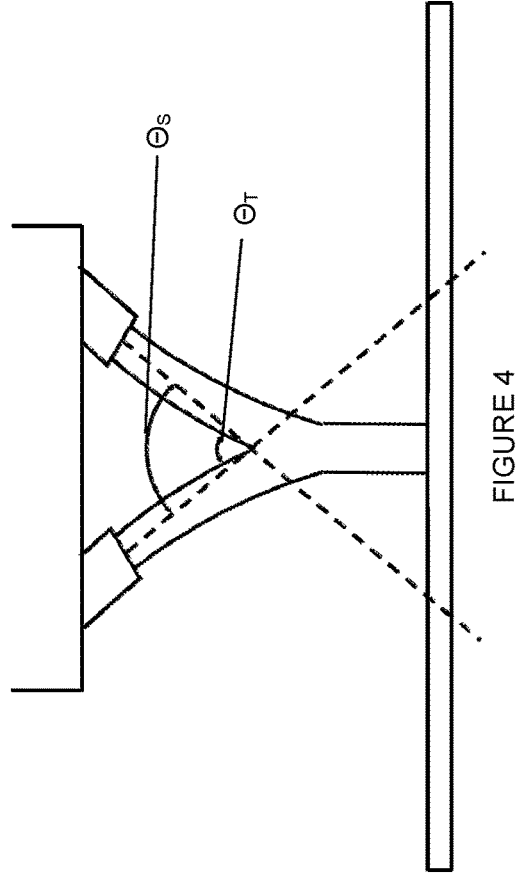
FIG. 4 is a schematic view of delivery from a liquid dispensing device according to the present invention to illustrate deviation between the straight flowpath intersection angle and the true flowpath intersection angle.

FIG. 3B shows dotted lines indicated the theoretical flowpath of liquids 10 and 10' assuming that the liquid is ejected from the tubes 11 and 11' along a straight path. The point "P" at which the flowpaths intersect corresponds to the straight flowpath intersection height, which in this case is 10 mm above the surface of rotating wafer 12. The straight flowpath intersection angle represented by $\theta_S$ is 26°. The true flowpath intersection angle $\theta_T$ in this case is approximately the same as that calculated based on straight flows, since the liquid flow rate and proximity to the surface of the rotating wafer 12 mean that there are no significant deviations from straight flow. This is in contrast to the situation shown in FIG. 4, where the combination of a lower flow rate and steeper nozzle angle means that the straight flowpath angle $\theta_S$ is greater than the true flowpath angle $\theta_T$, and similarly the true intersection height is lower than that anticipated based on straight flowpath height.

FIG. 5 shows implementation of an RCA clean using the three tube liquid dispensing device shown in FIGS. 1-4, in which deionised water is dispensed from the first tube, an aqueous mixture of ammonia and hydrogen peroxide in deionised water is dispensed from the second tube, and an aqueous mixture of sulphuric acid and hydrogen peroxide in deionised water is dispensed from the third tube. The shaded regions indicate transition phases, during which liquid is delivered simultaneously from the relevant tubes.

Figure 7:
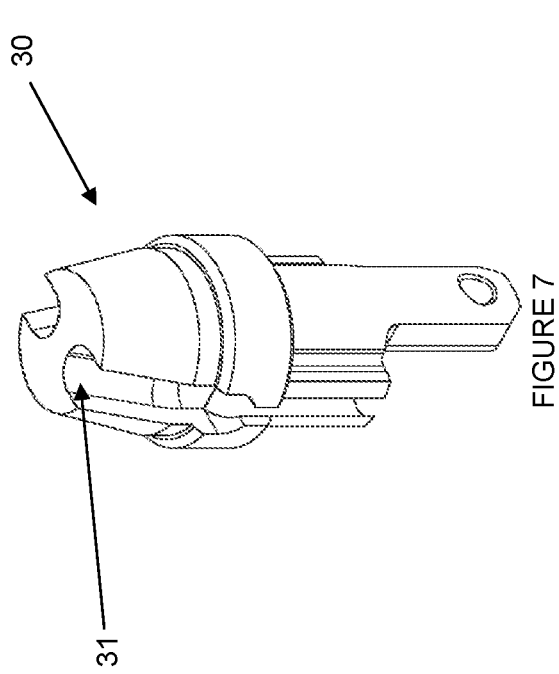
FIG. 7 is a schematic view of the bottom of a two-tube spacer.

FIGS. 6A and 6B show the spacer component of FIG. 2 in greater detail. The spacer 20 includes three channels 21 for receiving liquid delivery tubes (not shown). The spacer includes a collar 22, having a diameter comparable to the inner chamber of the housing in order to stably position the spacer horizontally within the housing. The collar is provided with a screw thread on its outer surface (not shown) to engage with a corresponding screw thread within the housing. The collar also has an upper abutment surface 23 which abuts the mouth region of the tubular section 3 of the housing in use (see FIG. 2) to vertically position the spacer within the housing and prevent the spacer being pushed too far within the housing, and a lower abutment surface which abuts a corresponding stop surface in the detachable cap. Below the collar, a tapered section 24 is provided which fits within the corresponding inwardly tapered chamber of the housing, which bends the tubes into position. Above the collar, scalloped sections 25 (that is, the "empty" regions between channels) help to minimise friction during insertion of the spacer into the housing, and generally reduce the amount of material used to manufacture the spacer. The spacer 20 also incorporates an anchor section 26, with a screw hole 27 which can be used to secure the spacer to the housing using a screw, as shown in FIG. 2A. FIG. 7 is an alternative spacer 30, having only two channels 31 for receiving liquid delivery tubes (not shown), the other features being identical to those shown for spacer 20.

Figure 8A:
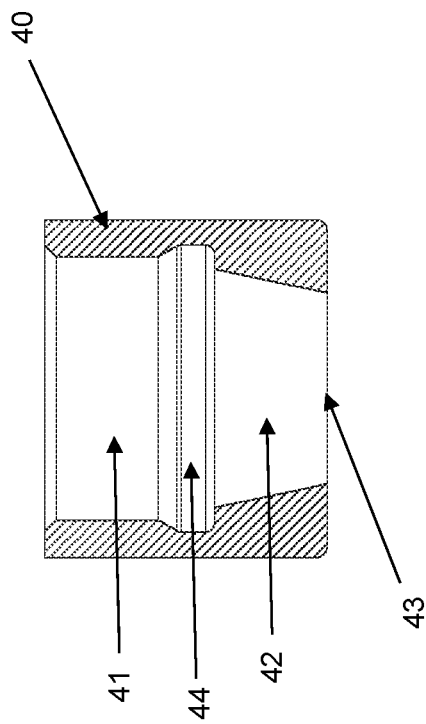
FIGS. 8A, 8B, 8C show a detachable cap of the liquid dispensing device of the present invention, and are respectively a top perspective view, a bottom perspective view, and a cross-section view.
Figure 8C:
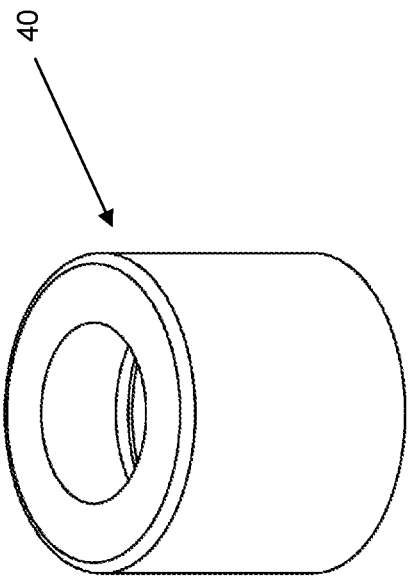
Figure 8B:
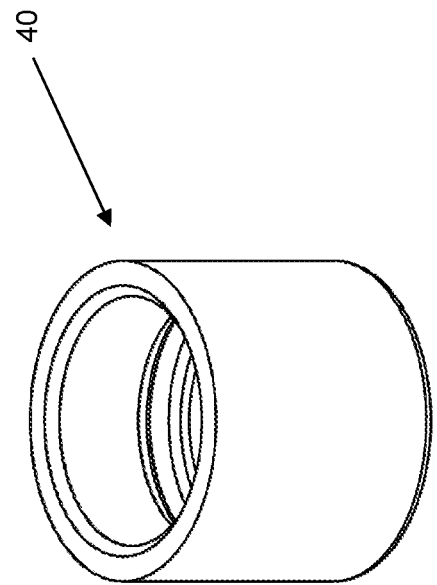

FIGS. 8A-C show the features of the detachable cap 40 in greater detail. FIG. 8A is a cross-sectional view of the cap 40. The cap includes an upper chamber 41 with a diameter corresponding to the collar 22 of spacer 20. The surface of the upper chamber includes a screw thread (not shown) which screws onto a corresponding screw thread provided on the collar of a spacer, to hold the cap in place. The cap also has a lower chamber 42, having a frusto-conical shape terminating at an open exit port 43. The lower chamber has a cone angle of ~22°, which guides the liquid delivery tubes into their inwardly angled configuration in conjunction with the tapered section of the spacer. Between the upper chamber 41 and lower chamber 42 is an intermediate chamber 44, having a larger diameter to allow for the outward bulging of the plastic liquid delivery tubes as they are bent into position, and to avoid chafing of the tubes. FIGS. 8B and 8C respectively show a view of the cap into the upper chamber 41 and lower chamber 42, illustrating the narrower cross section at the exit port 43.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

The invention claimed is:

1. A liquid dispensing device suitable for carrying out a method for treating the surface of a wafer with multiple liquids, the method comprising rotating the surface of the wafer and discharging different liquid streams onto the rotating surface in a sequence from separate outlets, wherein the discharge of liquid streams which are contiguous in the sequence overlaps during a transition phase, and wherein during the transition phase the liquid streams merge after exiting said outlets to form a merged liquid stream before impacting the rotating surface;

wherein the liquid dispensing device comprises:
a housing, defining an internal chamber opening at an exit port;
a spacer, located within the internal chamber of the housing; and
two or more liquid delivery tubes, passing along the spacer within the internal chamber of the housing, and extending to the exit port;
wherein the two or more liquid delivery tubes are bent around the spacer so that the tubes' outlets are inwardly angled towards one another, such that in use liquid streams delivered from the outlets of the two or more liquid delivery tubes merge to form a merged liquid stream.

2. The liquid dispensing device according to claim 1, wherein the housing and spacer clamp the two or more liquid delivery tubes in position, and the internal chamber of the housing narrows at or towards the exit port so as to bend the liquid delivery tubes around the spacer and thereby orient the tubes' outlets into said inwardly angled configuration.

3. The liquid dispensing device according to claim 1, wherein the spacer has one or more channels which accommodate the liquid delivery tubes.

4. The liquid dispensing device according to claim 1, wherein the housing comprises a main body and a detachable cap, wherein the detachable cap includes said exit port.

5. The liquid dispensing device according to claim 1, wherein the straight flowpath intersection angle of the tubes' outlets is 10° to 40°.

6. A cleaning apparatus for carrying out a method for treating the surface of a wafer with multiple liquids, the method comprising rotating the surface of the wafer and discharging different liquid streams onto the rotating surface in a sequence from separate outlets, wherein the discharge of liquid streams which are contiguous in the sequence overlaps during a transition phase, and wherein during the transition phase the liquid streams merge after exiting said outlets to form a merged liquid stream before impacting the rotating surface, the cleaning apparatus comprising:
a cleaning chamber; and
a rotatable wafer holder in the cleaning chamber;

a liquid dispensing device comprising:
- a housing, defining an internal chamber opening at an exit port;
- a spacer, located within the internal chamber of the housing; and
- two or more liquid delivery tubes, passing along the spacer within the internal chamber of the housing, and extending to the exit port;

wherein the two or more liquid delivery tubes are bent around the spacer so that the tubes' outlets are inwardly angled towards one another, such that in use liquid streams delivered from the outlets of the two or more liquid delivery tubes merge to form a merged liquid stream.

7. The liquid dispensing device according to claim 1, wherein the spacer is a separate component.

8. The liquid dispensing device according to claim 1, wherein the spacer is replaceable and removeable from the housing.

9. The liquid dispensing device according to claim 1, wherein the liquid delivery tubes are a separate components from the spacer and the housing.

10. The liquid dispensing device according to claim 9, wherein the spacer has one or more channels/grooves which accommodate the liquid delivery tubes.

11. The liquid dispensing device according to claim 10, wherein the channels of the spacer are open channels.

12. The liquid dispensing device according to claim 10, wherein the housing has one or more channels/grooves which accommodate the liquid delivery tubes.

13. The liquid dispensing device according to claim 12, wherein the channels/grooves on the housing and spacer are complementary so as to form a closed conduit which accommodates the liquid delivery tubes when the housing and spacer are assembled together.

* * * * *